(12) United States Patent
Muuss

(10) Patent No.: US 10,372,864 B2
(45) Date of Patent: Aug. 6, 2019

(54) GLOBAL ROUTING IN CIRCUIT DESIGN

(71) Applicant: INTERNATIONAL BUSINESS MACHINES CORPORATION, Armonk, NY (US)

(72) Inventor: Karsten Muuss, Niederkassel (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 14 days.

(21) Appl. No.: 15/293,512

(22) Filed: Oct. 14, 2016

(65) Prior Publication Data
US 2018/0107778 A1    Apr. 19, 2018

(51) Int. Cl.
*G06F 17/50* (2006.01)

(52) U.S. Cl.
CPC ................. *G06F 17/5077* (2013.01)

(58) Field of Classification Search
USPC ......................................................... 716/129
See application file for complete search history.

(56) References Cited

U.S. PATENT DOCUMENTS

| | | | |
|---|---|---|---|
| 5,825,659 A * | 10/1998 | Nguyen | G06F 17/5077 716/130 |
| 7,062,743 B2 | 6/2006 | Kahng et al. | |
| 7,100,129 B1 | 8/2006 | Salowe et al. | |
| 7,624,367 B2 | 11/2009 | Frankle et al. | |
| 7,685,553 B2 | 3/2010 | Papadopoulou et al. | |
| 8,091,058 B2 | 1/2012 | Ballard et al. | |
| 8,095,906 B2 | 1/2012 | Betz et al. | |
| 8,370,786 B1 | 2/2013 | Burstein | |
| 8,418,113 B1 | 4/2013 | Alpert et al. | |
| 8,677,302 B2 | 3/2014 | Gao | |
| 9,003,344 B2 | 4/2015 | Kennedy et al. | |
| 2011/0154282 A1 * | 6/2011 | Chang | G06F 17/5068 716/120 |
| 2013/0086544 A1 | 4/2013 | Alpert et al. | |

(Continued)

OTHER PUBLICATIONS

Kubo et al., "Global Routing by Iterative Improvements for Two-Layer Ball Grid Array Packages", Apr. 2006, IEEE Transactions on Computer-Aided Design of Integrated Circuits and Systems, vol. 25 No. 4, pp. 725-733.*

(Continued)

*Primary Examiner* — Bryce M Aisaka
(74) *Attorney, Agent, or Firm* — Cantor Colburn LLP; Erik Johnson

(57) ABSTRACT

A method includes receiving a routing grid that includes nets each net having a bounding box maximum dimension, a net length and a number of pins associated with each of the nets, generating a list of the nets, the list of the nets sorted in order by the bounding box maximum dimension, the net length, and the number of pins associated with each of the nets, calculating a sum of the number of pins, calculating a sum of the length of the nets, identifying a net for which a difference of the sum of the number of pins and the sum of the length of the nets is a maximum value, determining the bounding box maximum of the identified net, calculating a tile size as a function of the bounding box maximum, performing a global routing process using the calculated tile size to generate a global routing design.

20 Claims, 3 Drawing Sheets

(56) References Cited

U.S. PATENT DOCUMENTS

2015/0007123 A1    1/2015   Chang et al.

OTHER PUBLICATIONS

Xiang et al. "Min-Cost Flow-Based Algorithm for Simultaneous Pin Assignment and Routing", Jul. 2003, IEEE Transactions on Computer-Aided Design of Integrated Circuits and Systems, vol. 22 No. 7, pp. 870-878.*

Hu, "High-performance Global Routing for Trillion-gate Systems-on-Chips", Computer Science and Engineering in the University of Michigan, 2013, pp. 1-156.

* cited by examiner

GLOBAL ROUTING IN CIRCUIT DESIGN

BACKGROUND

The present invention generally relates to designing integrated circuits, and more specifically, to performing global routing in integrated circuit design.

Integrated circuits are often designed by designing the functions and logic that meet a desired system specification. Once the functional and logical designs are completed, a circuit design is generated.

The physical design is generated by using the circuit design and determining where the elements of the circuit design will be arranged on the chip.

One aspect of physical design is global routing. Global routing is often performed by a global router (a global routing tool) that identifies pins in the physical design and nets associated with the pins. The global router uses the pins and nets associated with the pins to route communicative or conductive connections between nets.

The overall goal of a typical global routing process is to generate conductive connections between nets in the circuit design.

Once the global routing process has been performed, local routing processes are used to route conductive connections within the identified nets to substantially complete the physical design of the connections between elements of the physical design.

SUMMARY

According to an embodiment of the present invention, a method for fabricating an integrated circuit on a wafer, includes receiving a routing grid that includes nets each net having a bounding box maximum dimension, a net length and a number of pins associated with each of the nets, generating a list of the nets, the list of the nets sorted in order by the bounding box maximum dimension, the net length, and the number of pins associated with each of the nets, calculating a sum of the number of pins, calculating a sum of the length of the nets, identifying a net for which a difference of the sum of the number of pins and the sum of the length of the nets is a maximum value, determining the bounding box maximum of the identified net, calculating a tile size as a function of the bounding box maximum, performing a global routing process using the calculated tile size to generate a global routing design, and using the global routing design to fabricate an integrated circuit on a wafer.

According to another embodiment of the present invention, a system for fabricating an integrated circuit on a wafer, includes a memory, and a processor operative to receive a routing grid that includes nets each net having a bounding box maximum dimension, a net length and a number of pins associated with each of the nets, generate a list of the nets, the list of the nets sorted in order by the bounding box maximum dimension, the net length, and the number of pins associated with each of the nets, calculate a sum of the number of pins, calculate a sum of the length of the nets, identify a net for which a difference of the sum of the number of pins and the sum of the length of the nets is a maximum value, determine the bounding box maximum of the identified net, calculate a tile size as a function of the bounding box maximum, perform a global routing process using the calculated tile size to generate a global routing design, and save the global routing design in the memory.

According to yet another embodiment of the present invention, a computer program product comprising a computer readable storage medium having program instructions embodied therewith, the program instructions executable by a processor to cause the processor to perform a method for fabricating an integrated circuit on a wafer, that includes receiving a routing grid that includes nets each net having a bounding box maximum dimension, a net length and a number of pins associated with each of the nets, generating a list of the nets, the list of the nets sorted in order by the bounding box maximum dimension, the net length, and the number of pins associated with each of the nets, calculating a sum of the number of pins, calculating a sum of the length of the nets, identifying a net for which a difference of the sum of the number of pins and the sum of the length of the nets is a maximum value, determining the bounding box maximum of the identified net, calculating a tile size as a function of the bounding box maximum, performing a global routing process using the calculated tile size to generate a global routing design, and using the global routing design to fabricate an integrated circuit on a wafer.

DETAILED DESCRIPTION

Figure 1:
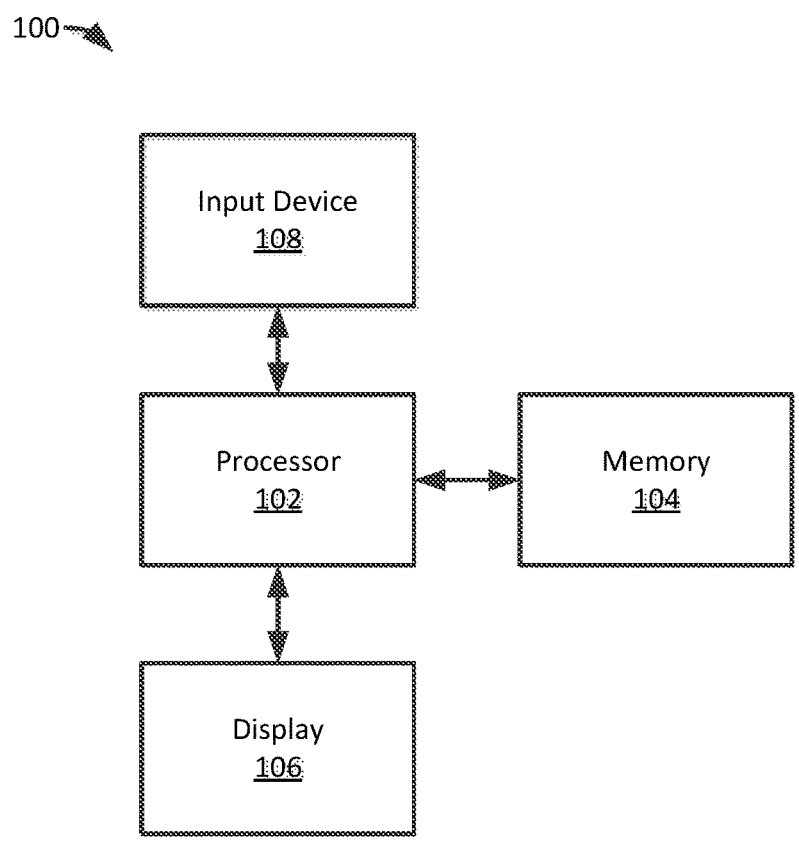
FIG. 1 illustrates a block diagram of a processing system.

As discussed above, the global routing process is used to design communicative or conductive connections between nets of the circuit design. The use of a global router tool provides a method for identifying the pins and nets of a circuit design, and designing routes for conductive lines in the physical design to electrically connect the nets. A net may be defined as a group of circuit elements arranged on a wafer the nets include pins where a pin is a connective node of a portion of a circuit. Though each pin in a circuit design is usually connected to another pin via a conductive line, global routing routes conductive lines to between particular pins to provide a high level design of a portion of the conductive lines. Generally, the global routing is used to route connective lines between pins of different nets, while detailed routing is generally used to route connective lines between pins in the same net. By performing quality global routing prior to detailed routing, congestion of conductive lines in the physical design may be avoided or mitigated.

In this regard, global routers often operate by receiving a partial physical design of a circuit that includes the locations of the elements (e.g., transistors, logic gates, resistors, capacitors) of the circuit design with the exception of the connections between the elements. The global routers received data that includes the outline of the design, the pin locations and nets (sets of pins to be connected). The global routers may use additional constraints that are associated with each net such as, for example, minimum conductive line widths or spacing to other nets.

The global routers use a routing grid that includes the physical location of the nets and their associated pins. The routing grid is a stack of routing layers that may include alternating preferred routing directions (e.g., X or Y). In each layer, the conductive lines have a designated width and spacing that implicitly defines the minimum spacing distance between conductive lines. The technology data describes a set of parallel tracks in a preferred direction for each layer, such that routed conductive lines should align with the tracks to improve density. Vias are the vertical interconnections between layers. The vias generally are located at intersections of tracks of adjacent layers. The combination of the tracks and the via locations are used to further define the routing grid.

The global routers split the routing grid into tiles of substantially equal or substantially similar sizes (areas). When the global routers identify pins in different tiles that should be connected (in accordance with the circuit design) the global routers generate a route for a conductive line that will connect the pin of a first tile to the pin of the second tile. A conductive line includes, for example, a metallic line formed on a circuit that is operative to connect pins of the nets. The metallic line is often formed in an insulator material that may be etched to form a trench in the insulator material. The trench is filled with a conductive material to form the conductive line.

In this regard, the size of the tiles (tile size) used when performing a global routing operation may be selected by a user prior to running the global router tool. The size of the tile relative to the number of pins or the complexity of the circuit design affects the quality of the global routing design (i.e., the usefulness of the routes of the conductive lines between the pins for completing the physical design). The size of the tiles relative to the complexity of the circuit design also affects the runtime of the global router tool. Indeed, the runtime of the global router tools may be long and costly when a small tile size is used by a router tool to route conductive lines in a relatively complex circuit design.

In previous methods, the user often determined tile size for a global routing process by trial and error. Such a method often resulted in excessive consumption of valuable processing resources, and an unsatisfactory global routing design, which would often result in running a second global routing process using a different tile size (e.g., larger or smaller tiles). Such an approach would consume even more processing resources without necessarily resulting in a quality or useful global routing design.

The methods, systems, and computer readable storage media described herein provide for a method of determining a tile size of a given integrated circuit design to perform global routing that outputs useful routes for conductive connections between design elements without unnecessarily consuming valuable computing resources. The methods described herein improve the performance of the global routing system in that the performance of the system is improved by generating a quality global routing design without wasting computing resources, which results in the more efficient and improved operation of the processing system.

In this regard, FIG. 1 illustrates a block diagram of a processing system 100. The system 100 includes a processor 102 communicatively connected to a memory 104, a display 106, and an input device 108.

Figure 2:
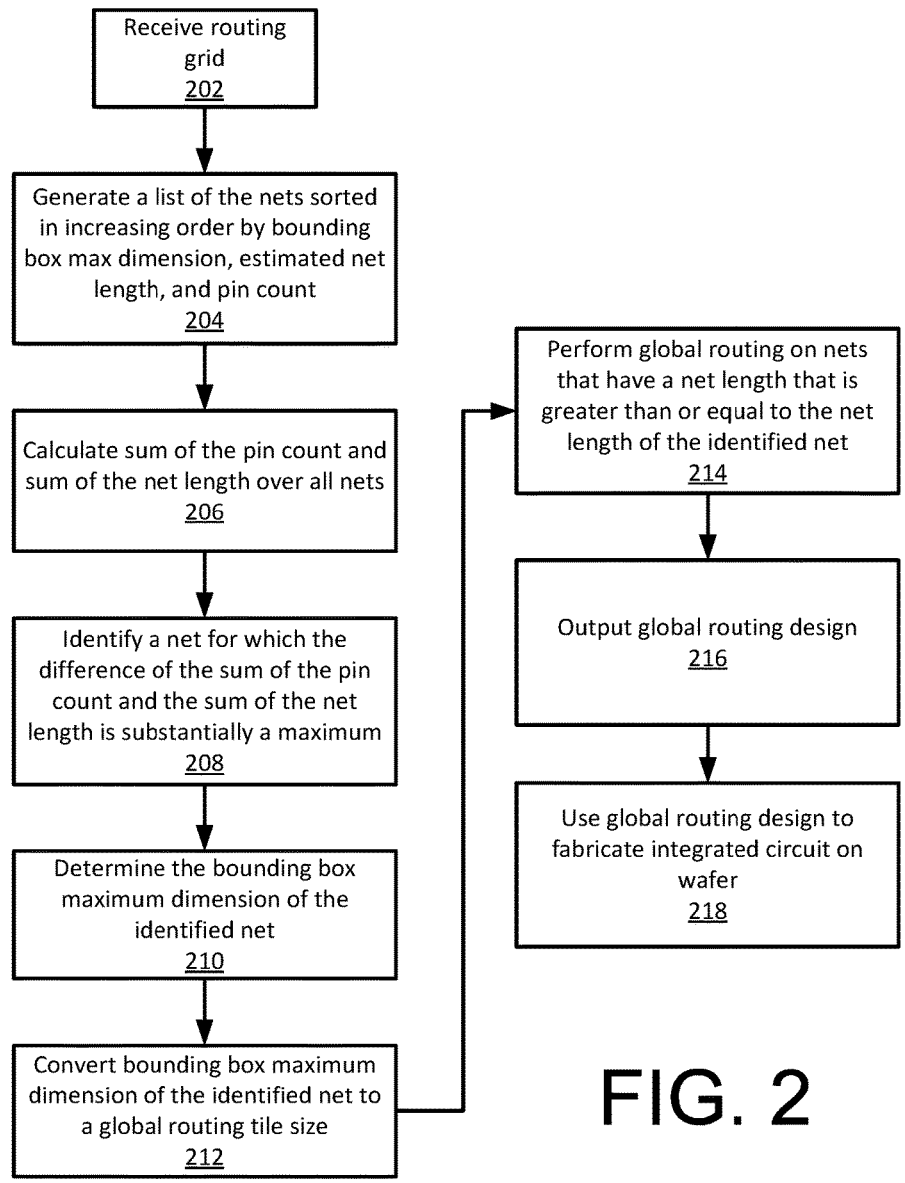
FIG. 2 illustrates a block diagram of an exemplary method for determining a tile size in a global routing process that may be performed by the system (of FIG. 1).

FIG. 2 illustrates a block diagram of an exemplary method for determining a tile size in a global routing process that may be performed by the system 100 (of FIG. 2). In block 202, the global routing grid is received by the processor 102.

The global routing grid is a graph includes the tiles as vertices and edges between each adjacent tile. The amount of possible connections between two adjacent tiles is used to define a (routing) capacity for each edge. A net is subject to global routing if it has pins in more than one tile and the global routing will compute a set of edges for each net. The edge set may be arranged as a tree like structure of edges, connecting the tiles, and represents a global routing (solution) of the net.

For each net there are often many possible global routing solutions. Each edge can be used by only a limited number of nets (capacity). The objective of global routing is to find a global routing for each net, such that all edges do not exceed the capacity.

The pin count of a net is the number of pins in a net. The bounding box of a net is the smallest rectangular area that includes all of the pins of a net. The bounding box length is the sum of the X and Y dimensions of the bounding box. The maximum dimension of a bounding box is the maximum X and Y dimensions of the bounding box.

In block 204, the processor 102 generates a list of the nets that is sorted in increasing order by the bounding box maximum dimension, estimated net length, and the pin count of each of the nets. The sorted list of nets includes a unique identifier of each of the nets ranked according to the length of each of the nets (the net length). The (Steiner) net length is the minimal length of a set of conductive lines that connect all of the pins of the net. The net length often has a tree-like structure called a tree. The tree may be generated using a heuristic input that returns estimates of the net lengths.

Figure 3:
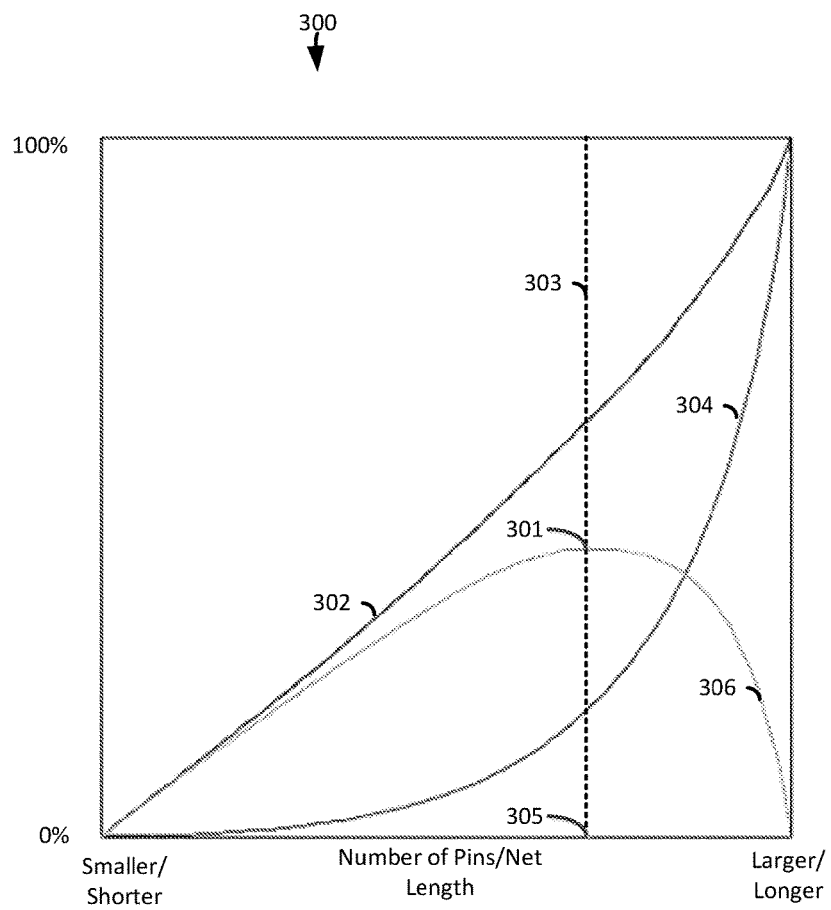
FIG. 3 illustrates a graph that includes a line that shows a plot of the sum of the pin count as a percentage of pins and a line that shows a plot of the sum of the net lengths as a percentage of net lengths.

In block 206, the sum of the pin count and the sum of the net length over all of the nets is calculated. In this regard, FIG. 3 illustrates a graph 300. The graph 300 includes line 302 that shows a plot of the sum of the pin count as a percentage of pins and line 304 that shows a plot of the sum of the net lengths as a percentage of net lengths.

Referring to FIG. 2, in block 208, the processor 102 (of FIG. 1) identifies a net for which the difference of the sum of the pin count and the sum of the net length is substantially at a maximum value. Referring to FIG. 3, the graph 300 includes line 306, which shows a plot of the difference between the line 302 (the plot of the sum of the pin counts) and the line 304 (the plot of the sum of the net lengths). The point 301 is the maximum (point with zero slope) of the line 306 (the plot of the difference between the sum of the pin counts and the sum of the net lengths). Thus, the vertical line 303 that runs through the point 301 and intersects the line 304 is used to identify a particular net having a net length with a maximum difference from the number of pins.

In this regard, once the net length at the maximum of the line 306 (i.e., the value on the horizontal axis of the point 301) is identified, the intersection of the line 303 with the line 304 (the plot of the sum of the net lengths) will yield a substantially optimal net length. In other words, the substantially optimal net length may be calculated by calculating the maximum of the difference between the sum of the number of pins and the sum of the net lengths (the point 301 where the plot line 301 has a slope of zero) and identifying a minimum net length on the horizontal axis, which is shown as point 305 on the horizontal axis.

Once the minimum net length is identified, the list of nets that was generated in block 204 may be used to identify a net in the list of nets that has a net length equal to, substantially equal to or close to the minimum net length.

Referring to FIG. 2, once the net having the minimum net length is identified, the bounding box maximum dimension of the identified net is determined in block 210. With the list of nets sorted by net length and pin count, the list is divided into two sets. A first set includes small nets that are represented in graph 300 to the left of point 301 (of FIG. 3) and a second set includes larger nets that are represented on the graph 300 to the right of point 301. The resultant tile size should be calculated such that most of the nets in the second set are subjected to global routing while most of the nets in the first set are not subjected to global routing. The nets in the first set may be subjected to global routing if the smaller net falls on more than one tile.

In block 212, the processor converts the bounding box maximum dimension of the identified net into a corresponding tile size. Where the tile size is a function of the bounding box maximum dimension of the identified net. In this regards, the smallest bounding box maximum dimension may be calculated over the nets in the second set (large nets), and the smallest bounding box maximum dimension may be used as the tile size. However, alternate embodiments may use other methods for calculating the tile size from the bounding box dimensions.

In block 214, a global routing routine is performed using the tile size on all nets that have a net length that is greater or equal to the net length of the identified net having a minimum net length. In block 216, the global routing design may be output to be stored the memory 104 and/or output to a user on the display 106. In block 218 the global routing design is used to fabricate an integrated circuit on a wafer.

The technical effects and benefits of the embodiments described herein improve the performance of a processor performing global routing tasks by calculating a substantially optimal tile size for a given circuit design that will be analyzed by the global router. Using the substantially optimal tile size during the global routing process results in the output of a useful global routing design that may be used to fabricate an integrated circuit while reducing the unnecessary consumption of processing resources. Reducing the unnecessary consumption of processing resources improves the performance of the processing system.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating an integrated circuit on a wafer, the method comprising:
   receiving a routing grid that includes nets each net having a bounding box maximum dimension, a net length and a number of pins associated with each of the nets;
   generating a list of the nets, the list of the nets sorted in order by the bounding box maximum dimension, the net length, and the number of pins associated with each of the nets;
   calculating a sum of the number of pins;
   calculating a sum of the length of the nets;
   identifying a net for which a difference of the sum of the number of pins and the sum of the length of the nets is a maximum value;
   determining the bounding box maximum dimension of the identified net;
   calculating a tile size as a function of the bounding box maximum dimension;
   performing a global routing process using the calculated tile size to generate a global routing design; and
   using the global routing design to fabricate an integrated circuit on a wafer.

2. The method of claim 1, wherein each net of the nets includes a pin.

3. The method of claim 1, wherein the bounding box maximum dimension is the sum of the maximum length of two sides of a bounding box, where a bounding box of a net is a smallest rectangular area that contains all pins of the net.

4. The method of claim 1, wherein the net length is a minimal length of a set of conductive lines that connect all of the pins in a net.

5. The method of claim 1, wherein a pin includes a connection node between a conductive line and a logic device.

6. The method of claim 1, wherein the tile size is a size of a plurality of tiles used to perform the global routing process.

7. The method of claim 1, wherein the global routing design includes a route of a conductive line that connects pins of the nets.

8. A system for fabricating an integrated circuit on a wafer, comprising:
   a memory; and
   a processor operative to:
   receive a routing grid that includes nets each net having a bounding box maximum dimension, a net length and a number of pins associated with each of the nets;
   generate a list of the nets, the list of the nets sorted in order by the bounding box maximum dimension, the net length, and the number of pins associated with each of the nets;
   calculate a sum of the number of pins;
   calculate a sum of the length of the nets;
   identify a net for which a difference of the sum of the number of pins and the sum of the length of the nets is a maximum value;
   determine the bounding box maximum dimension of the identified net;
   calculate a tile size as a function of the bounding box maximum dimension;
   perform a global routing process using the calculated tile size to generate a global routing design; and
   fabricate the integrated circuit based on the global routing design.

9. The system of claim 8, wherein each net of the nets includes a pin.

10. The system of claim 8, wherein the bounding box maximum dimension is the sum of the maximum length of two sides of a bounding box, where a bounding box of a net is a smallest rectangular area that contains all pins of the net.

11. The system of claim 8, wherein the net length is a minimal length of a set of conductive lines that connect all of the pins in a net.

12. The system of claim 8, wherein a pin includes a connection node between a conductive line and a logic device.

13. The system of claim 8, wherein the tile size is a size of a plurality of tiles used to perform the global routing process.

14. The system of claim 8, wherein the global routing design includes a route of a conductive line that connects pins of the nets.

15. A computer program product comprising a computer readable storage medium having program instructions embodied therewith, the program instructions executable by a processor to cause the processor to perform a method for fabricating an integrated circuit on a wafer, comprising:
   receiving a routing grid that includes nets each net having a bounding box maximum dimension, a net length and a number of pins associated with each of the nets;
   generating a list of the nets, the list of the nets sorted in order by the bounding box maximum dimension, the net length, and the number of pins associated with each of the nets;
   calculating a sum of the number of pins;

calculating a sum of the length of the nets;
identifying a net for which a difference of the sum of the number of pins and the sum of the length of the nets is a maximum value;
determining the bounding box maximum dimension of the identified net;
calculating a tile size as a function of the bounding box maximum dimension;
performing a global routing process using the calculated tile size to generate a global routing design; and
using the global routing design to fabricate an integrated circuit on a wafer.

16. The computer readable storage medium of claim 15, wherein each net of the nets includes a pin.

17. The computer readable storage medium of claim 15, wherein the bounding box maximum dimension is the sum of the maximum length of two sides of a bounding box, where a bounding box of a net is a smallest rectangular area that contains all pins of the net.

18. The computer readable storage medium of claim 15, wherein the net length is a minimal length of a set of conductive lines that connect all of the pins in a net.

19. The computer readable storage medium of claim 15, wherein a pin includes a connection node between a conductive line and a logic device.

20. The computer readable storage medium of claim 15, wherein the tile size is a size of a plurality of tiles used to perform the global routing process.

* * * * *